(12) United States Patent
Yen et al.

(10) Patent No.: US 12,061,355 B2
(45) Date of Patent: Aug. 13, 2024

(54) FRAME ASSEMBLY, BACKLIGHT MODULE AND DISPLAY DEVICE

(71) Applicant: Radiant Opto-Electronics Corporation, Kaohsiung (TW)

(72) Inventors: Chang-Ching Yen, Kaohsiung (TW); Cheng-Te Chang, Kaohsiung (TW); Pei-Fen Hou, Kaohsiung (TW)

(73) Assignee: RADIANT OPTO-ELECTRONICS CORPORATION, Kaohsiung (TW)

( * ) Notice: Subject to any disclaimer, the term of this patent is extended or adjusted under 35 U.S.C. 154(b) by 0 days.

(21) Appl. No.: 18/400,165

(22) Filed: Dec. 29, 2023

(65) Prior Publication Data

US 2024/0134111 A1 Apr. 25, 2024
US 2024/0230981 A9 Jul. 11, 2024

Related U.S. Application Data

(63) Continuation of application No. PCT/CN2022/124755, filed on Oct. 12, 2022.

(30) Foreign Application Priority Data

Aug. 26, 2022 (CN) .......................... 202211030689.3

(51) Int. Cl.
*F21V 8/00* (2006.01)
(52) U.S. Cl.
CPC .................................. *G02B 6/009* (2013.01)
(58) Field of Classification Search
CPC .................................................. G02B 6/009
See application file for complete search history.

(56) References Cited

U.S. PATENT DOCUMENTS 10,806,100 B1 * 10/2020 Trtilek .................... A01G 9/246
2008/0210843 A1 * 9/2008 Han ...................... H05K 5/0213
361/679.01

(Continued)

FOREIGN PATENT DOCUMENTS

CN 1383178 A 12/2002
CN 201506736 A 8/2013

(Continued)

*Primary Examiner* — Mary Ellen Bowman
(74) *Attorney, Agent, or Firm* — BACON & THOMAS, PLLC

(57) ABSTRACT

The frame assembly has a first direction and comprises a first frame, which has at least one exhausting passage, an adhesive layer, which has at least one through hole, and a second frame, which is connected to the first frame via the adhesive layer. A containing space is defined by the first frame and the second frame together and extends along the first direction. The exhausting passage fluidly communicates with the containing space and the external environment. The adhesive layer is disposed inside the containing space to divide the containing space into two venting passages that fluidly communicate with each other through the through hole. Residue air in the containing space is evacuated through the exhausting passage, increasing an adhered area and adhesion completeness of the adhesive layer, thereby increasing an adhesion-bonding strength of the two frames and structural stability of the frame assembly.

14 Claims, 13 Drawing Sheets

(56) References Cited

U.S. PATENT DOCUMENTS

| | | | | |
|---|---|---|---|---|
| 2013/0016524 A1* | 1/2013 | Momose | ............ | G02F 1/133308 362/613 |
| 2013/0242522 A1* | 9/2013 | Yoo | ...................... | H05K 5/0017 361/807 |
| 2016/0364056 A1* | 12/2016 | Chen | ...................... | G06F 3/0447 |
| 2019/0004241 A1* | 1/2019 | Zhang | .................. | H05K 1/0209 |
| 2019/0072810 A1* | 3/2019 | Yang | .................... | G02B 6/0088 |
| 2019/0339560 A1* | 11/2019 | Kim | ...................... | G06F 1/1637 |

FOREIGN PATENT DOCUMENTS

| | | |
|---|---|---|
| CN | 105785625 A | 7/2016 |
| CN | 112782890 A | 5/2021 |
| CN | 218735633 U | 3/2023 |
| JP | 2003330042 A | 11/2003 |
| JP | 2006078936 A | 3/2006 |
| JP | 2012230214 A | 11/2012 |
| TW | 201506736 A | 2/2015 |

\* cited by examiner

FRAME ASSEMBLY, BACKLIGHT MODULE AND DISPLAY DEVICE

CROSS-REFERENCE TO RELATED APPLICATIONS

This application is a continuation application of international Application No. PCT/CN2022/124755 filed on Oct. 12, 2022, which claims priority from China Patent Application Serial Number 202211030689.3, filed on Aug. 26, 2022. The entire contents of each of which are incorporated herein by reference.

BACKGROUND OF THE INVENTION

1. Field of the Invention

The present invention relates to a frame assembly which can enhance the bonding strength, relates to a backlight module having the frame assembly, and relates to a display device having the backlight module.

2. Description of Related Art

A display panel of a display device needs a backlight module served as a light source. The backlight module comprises a back plate, a light-emitting unit mounted on the back plate, and a frame connected to a perimeter of the back plate. Because the trend of the display panel nowadays goes toward a narrow-bezel design, a width of the frame of the backlight module must be narrowed down. However, due to the width narrowing, a clipping structure used to connect the back plate can hardly be mounted on the frame, therefore the frame can only be adhered to and fixed on the back plate through adhesive tapes.

However, because the width of the frame is limited, a width of the adhesive tapes is limited as well, hence an adhered area of the adhesive tapes is limited. Besides, when adhering the adhesive tapes onto the frame or the back plate, air may remain between the adhesive tapes and the frame or the back plate, hence the adhesive tapes are not completely adhered and the adhered area of the adhesive tapes is decreased. This leads to insufficient adhering-bonding strength, and such insufficient fixing thereby causes risk of frame peeling.

SUMMARY OF THE INVENTION

The main objective of the present invention is to provide a frame assembly, a backlight module, and a display device to solve the drawback that when assembling a frame assembly, adhesive tapes are not completely adhered and an adhered area of the adhesive tapes is decreased, causing insufficient adhesive strength.

The frame assembly has a first direction and comprises a first frame, an adhesive layer, and a second frame. The first frame has at least one exhausting passage formed inside the first frame. The adhesive layer has at least one through hole. The second frame is connected to the first frame through the adhesive layer. A containing space is defined by the first frame and the second frame together and extends along the first direction. The at least one exhausting passage of the first frame is in communication with the containing space and an external environment of the first frame. The adhesive layer is disposed in the containing space and divides the containing space into a first venting passage, adjacent to the first frame, and a second venting passage adjacent to the second frame. The first venting passage and the second venting passage are in communication with each other through the at least one through hole of the adhesive layer.

The first frame and the second frame of the frame assembly are adhered to connect by the adhesive layer. By evacuating the at least one exhausting passage of the first frame through an external vacuum device, the air in the second venting passage between the adhesive layer and the second frame can be guided through the at least one through hole of the adhesive layer to the first venting passage between the adhesive layer and the first frame, and then exported from the at least one exhausting passage to an external environment. Hence, the residue air between the adhesive layer and the first frame as well as between the adhesive layer and the second frame is withdrawn, so the first frame and the second frame are connected tightly. By decreasing the residue air, an adhered area and adhesion completeness of the adhesive layer are both increased, thereby enhancing an adhesion-bonding strength of the first frame and the second frame and increasing stability of the frame assembly.

The backlight module comprises said frame assembly, a light guiding plate and a light-emitting unit. The light guiding plate is mounted between the first frame and the second frame. The light-emitting unit is mounted between the first frame and the second frame and faces toward the light guiding plate.

The display device comprises said backlight module and a display panel, which is mounted at one of the first frame and the second frame. The light guiding plate faces the display panel.

The backlight module and the display device have the frame assembly, which has the containing space defined by the first frame and the second frame. The containing space is divided into the first venting passage and the second venting passage by the adhesive layer, and the two passages are in communication via the at least one through hole of the adhesive layer. Therefore, after air is evacuated through the at least one exhausting passage of the first frame, not only exhausting the residue air but also generating negative pressure in the containing space, which is in communication with the at least one exhausting passage, the adhesive layer starts to deform and eventually blocks up the at least one exhausting passage, so the containing space is in a vacuum state. By using a vacuum force to fix the first frame with the second frame, the backlight module and the display device will achieve a narrow frame design as well as enhance the bonding stability. Besides, other than applied in the backlight module and the display device, the frame assembly can be applied in other adhering-bonding components. For example, the frame assembly can be applied to structures having limited adhered areas, or applied to structures which are unable to design mechanical fixations due to narrow borders, thereby enhancing an adhering-bonding strength of those structures and enlarging the application scope of the frame assembly of the present invention.

DETAILED DESCRIPTION OF THE PREFERRED EMBODIMENT

Figure 1:
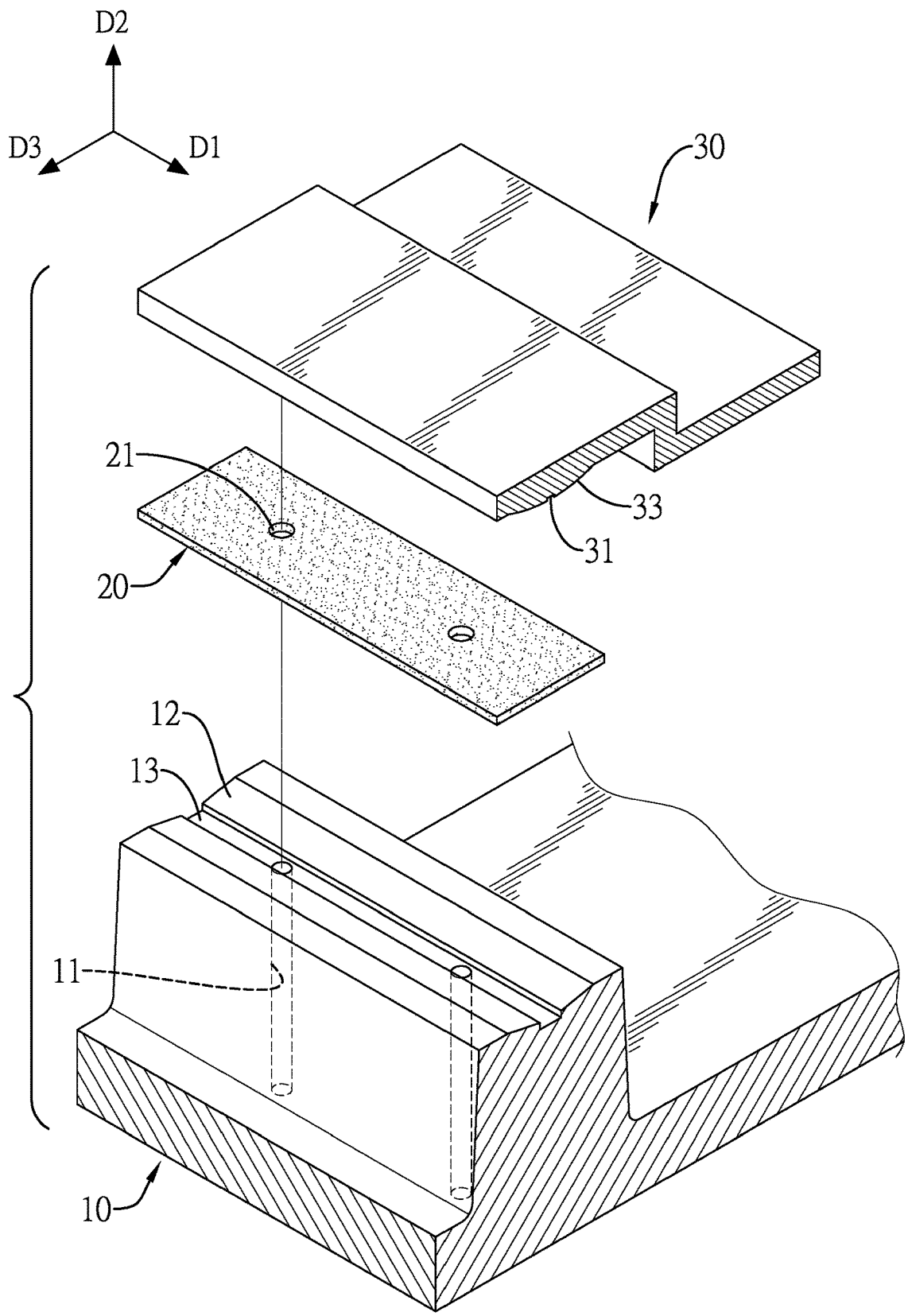
FIG. 1 is a partial exploded perspective view of a frame assembly in accordance with the present invention.
Figure 2:
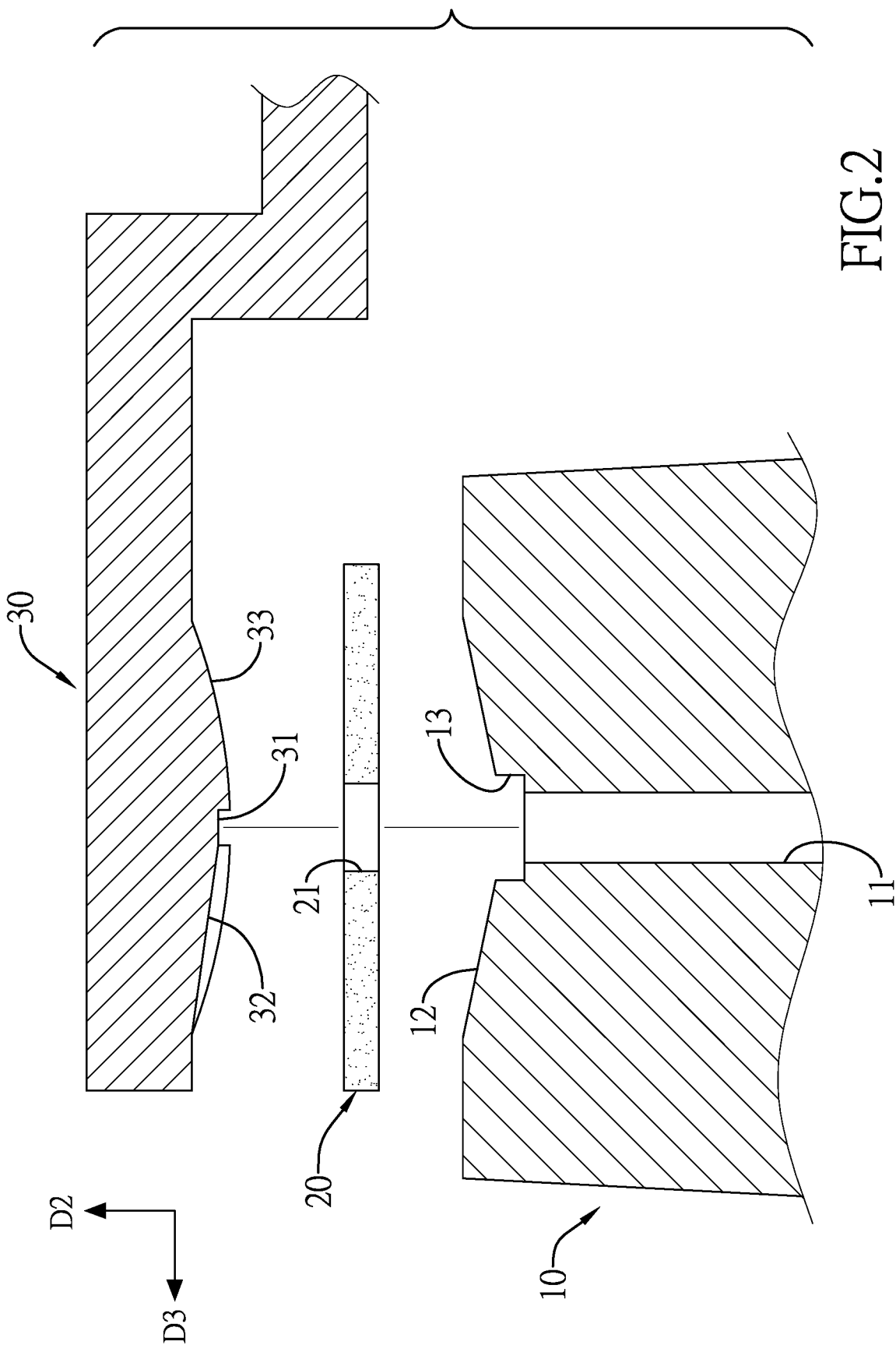
FIG. 2 is a partial exploded front sectional view of the frame assembly in accordance with the present invention.
Figure 3:
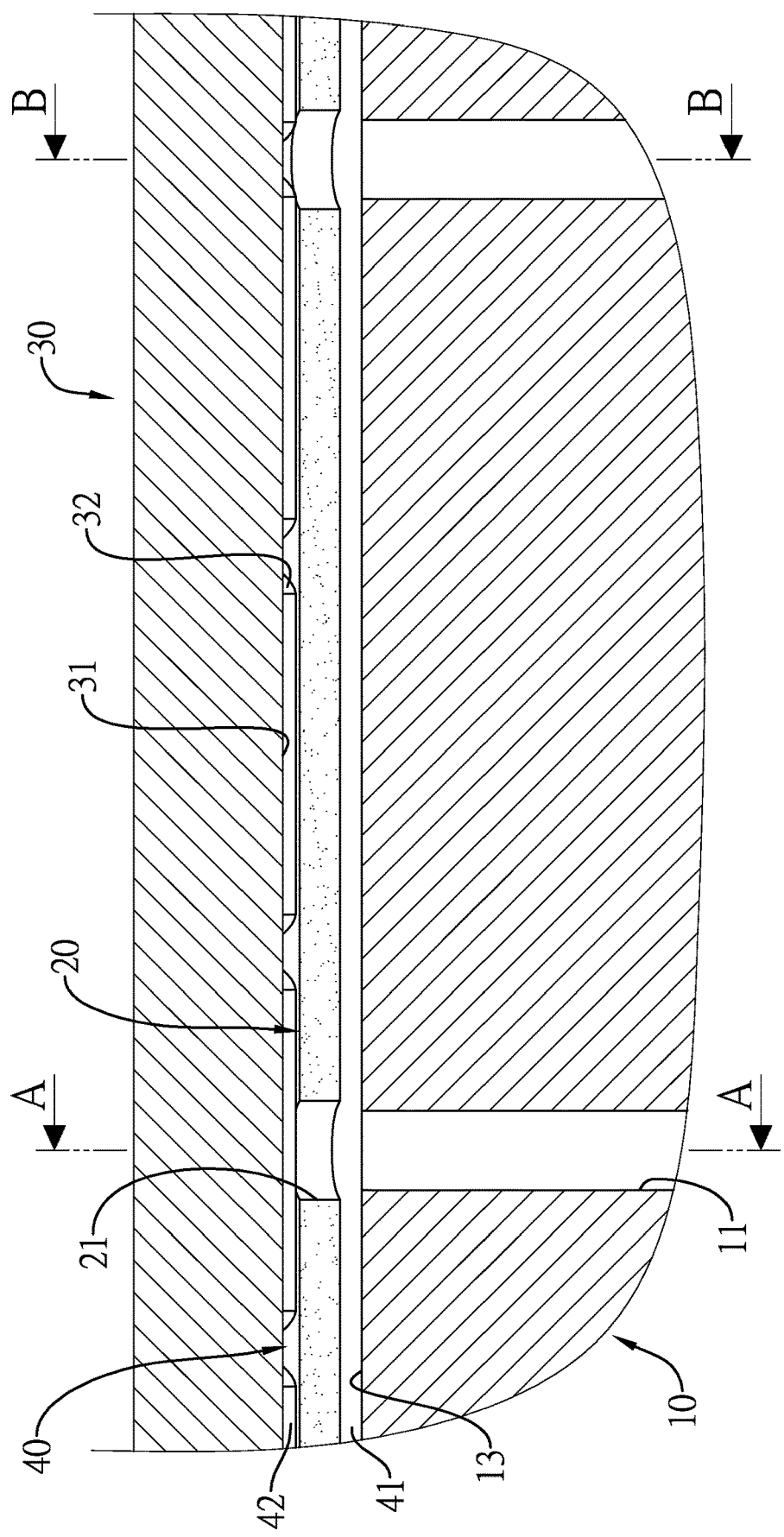
FIG. 3 is a partial side sectional view of the frame assembly in accordance with the present invention.

With reference to FIGS. 1 to 3, a frame assembly in accordance with the present invention has a first direction D1 and comprises a first frame 10, an adhesive layer 20, and a second frame 30.

As shown in FIGS. 1 and 2, the first frame 10 has at least one exhausting passage 11 formed inside the first frame 10. The adhesive layer 20 has at least one through hole 21. The second frame 30 is connected to the first frame 10 via the adhesive layer 20.

Additionally, as shown in FIGS. 3 to 5 and 11, a containing space 40 is defined by the first frame 10 and the second frame 30 together and extends along the first direction D1. The at least one exhausting passage 11 of the first frame 10 is in communication with the containing space 40 and an external environment of the first frame 10. The adhesive layer 20 is disposed in the containing space 40 to divide the containing space 40 into a first venting passage 41 and a second venting passage 42. The first venting passage 41 is adjacent to the first frame 10. The second venting passage 42 is adjacent to the second frame 30. The first venting passage 41 and the second venting passage 42 are in communication with each other through the at least one through hole 21 of the adhesive layer 20.

The first frame 10 and the second frame 30 of the frame assembly are adhered to connect with each other via the adhesive layer 20. By evacuating the at least one exhausting passage 11 of the first frame 10 through an external vacuum device, the air in the second venting passage 42 between the adhesive layer 20 and the second frame 30 can be guided through the at least one through hole 21 of the adhesive layer 20 to the first venting passage 41 between the adhesive layer 20 and the first frame 10, and then exported from the at least one exhausting passage 11 to an external environment. Hence, the residue air between the adhesive layer 20 and the first frame 10 as well as between the adhesive layer 20 and the second frame 30 is evacuated, also generating negative pressure in the containing space 40, which is in communication with the at least one exhausting passage 11, and hence the adhesive layer 20 starts to deform and eventually blocks up the at least one exhausting passage 11, so the containing space 40 is in a vacuum state. By using a vacuum force to fix the first frame 10 with the second frame 30, the first frame 10 and the second frame 30 respectively contact with and are adhered to the adhesive layer 20 more tightly. By reducing the residue air, an adhered area and adhesion completeness of the adhesive layer 20 are both increased, so the first frame 10 and the second frame 30 can be connected more tightly with each other, thereby enhancing structural stability of the frame assembly and avoiding risk of frame peeling. Additionally, the adhesive layer 20 is preferably an adhesive tape that is flexible and deformable.

Figure 5:
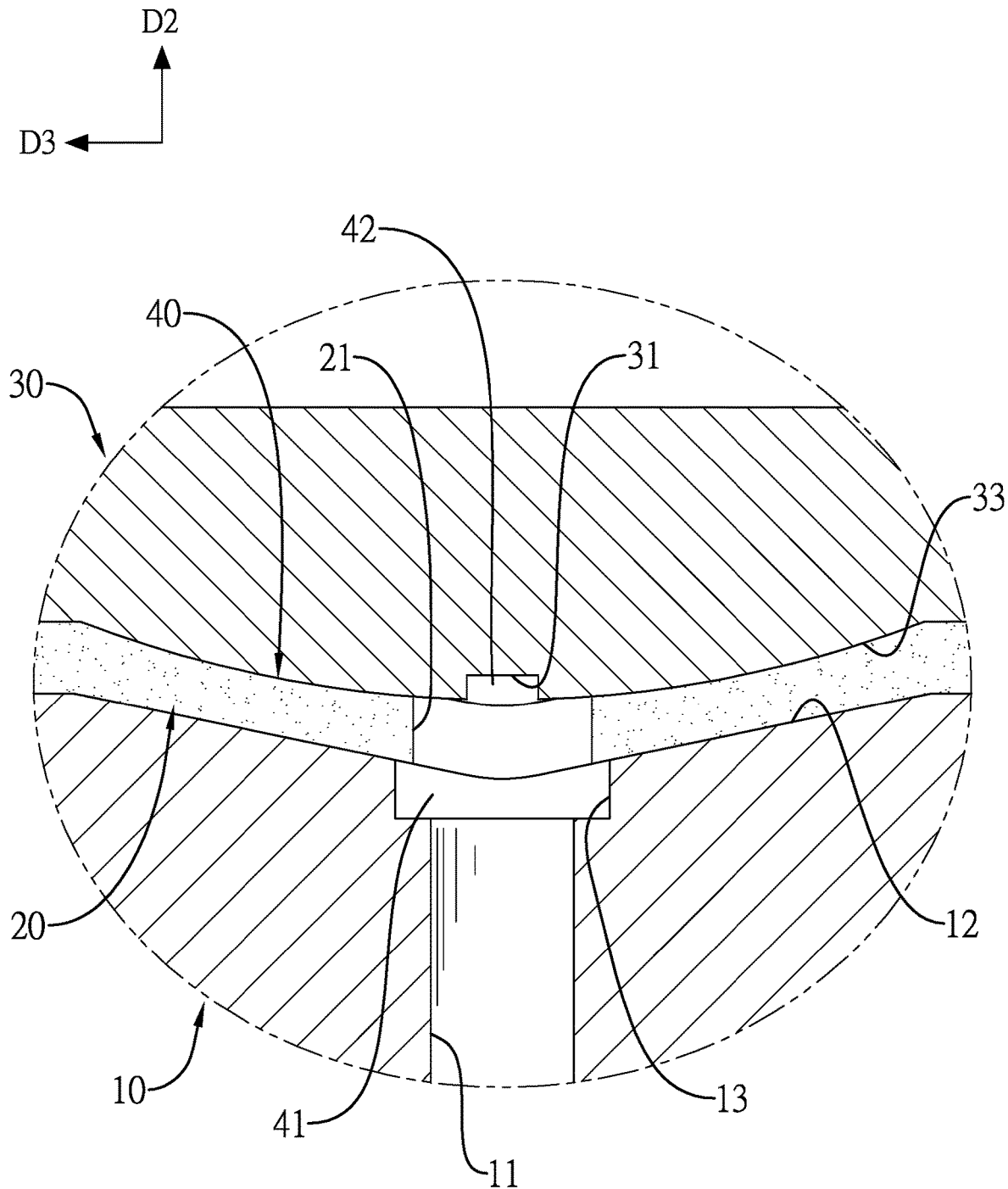
FIG. 5 is a partial enlarged sectional view of FIG. 4.

In addition, by a design of the at least one through hole 21 and the at least one exhausting passage 11 at least partially overlapped with each other, the second venting passage 42 is in communication with the at least one exhausting passage 11 through the at least one through hole 21. When the adhesive layer 20 is affected by the vacuum force and depresses downward to attach to the first frame 10, the residue air between the second frame 30 and the adhesive layer 20 can still pass the at least one through hole 21 and is evacuated through the at least one exhausting passage 11, thereby enhancing an adhesive strength of the second frame 30 and the adhesive layer 20. Preferably, as shown in FIGS. 3 and 5, a diameter of the at least one through hole 21 is larger than a diameter of the at least one exhausting passage 11. It is convenient to align the at least one through hole 21 and the at least one exhausting passage 11 when adhering the adhesive layer 20 and the first frame 10, increasing convenience of assembling the frame assembly. Furthermore, while evacuating the air to generate the negative pressure, a flowing path of the air is from a larger diameter to a smaller diameter, a sectional area of the at least one exhausting passage 11 has a sudden decrease, and hence pressure drops suddenly, thereby increasing a flowing velocity of the air. So, the air is evacuated from the at least one exhausting passage 11 smoothly and is not prone to blockage when flowing.

Preferably, the first frame 10 has multiple said exhausting passages 11, and the adhesive layer 20 has multiple said through holes 21, thereby increasing a venting efficiency. Furthermore, the at least one exhausting passage 11 can be linear or curved, as long as two ends of the said exhausting passage 11 are respectively connected to the containing space 40 and the external environment of the first frame 10, and the exhausting passage 11 can be used to evacuate air from the containing space 40.

Figure 4:
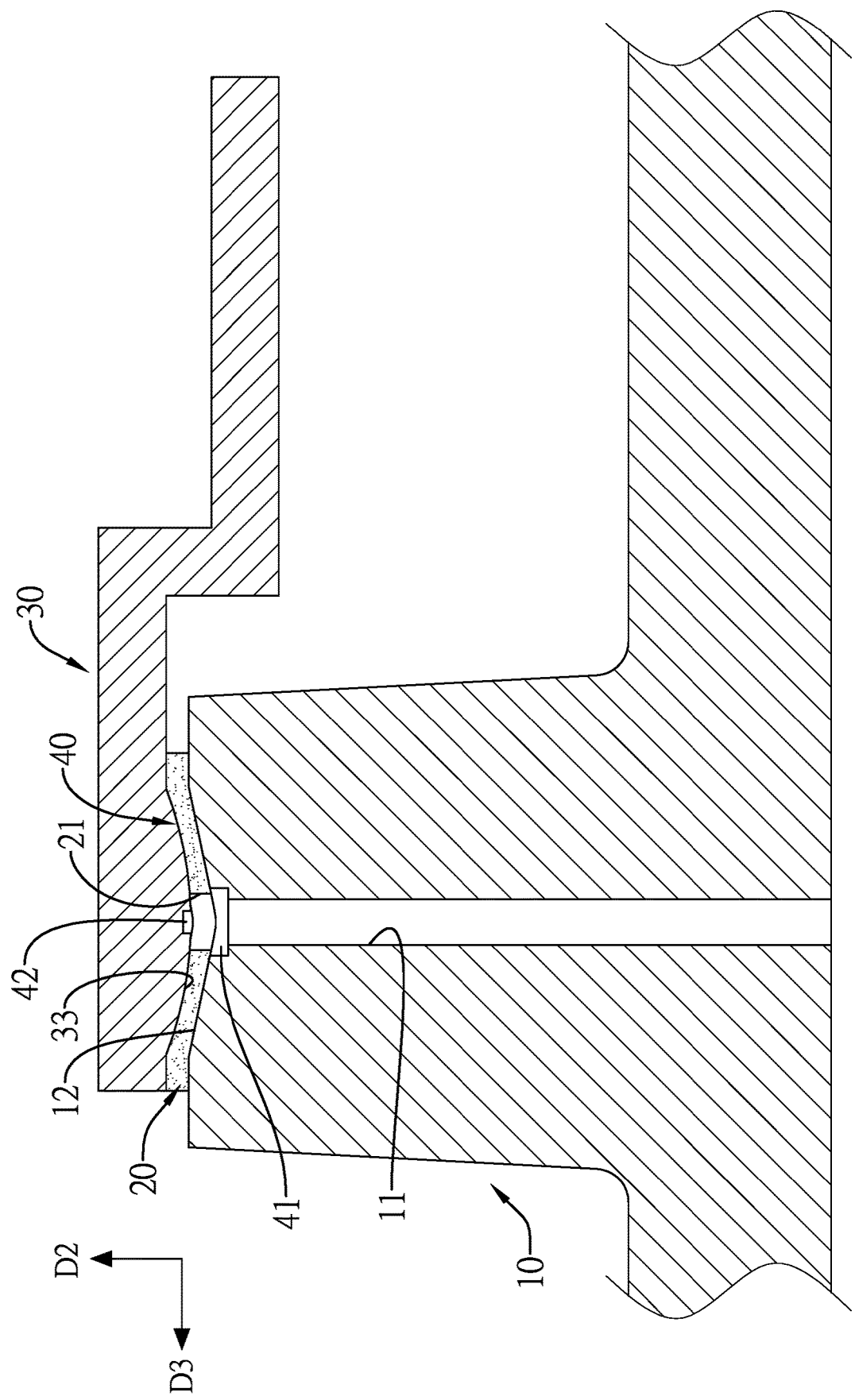
FIG. 4 is a sectional view across line A-A in FIG. 3.

In addition, as shown in FIGS. 3 and 4, the frame assembly has a second direction D2. The first direction D1 and the second direction D2 are non-parallel. The at least one exhausting passage 11 of the first frame 10 penetrates through the first frame 10 along the second direction D2. The at least one through hole 21 of the adhesive layer 20 penetrates through the adhesive layer 20 along the second direction D2. Preferably, the first direction D1 and the second direction D2 are perpendicular to each other, thereby increasing processing convenience of the at least one exhausting passage 11 of the first frame 10, and making an extending direction of the at least one exhausting passage 11 perpendicular to an extending direction of the containing space 40, hence increasing exhausting efficiency.

Figure 6:
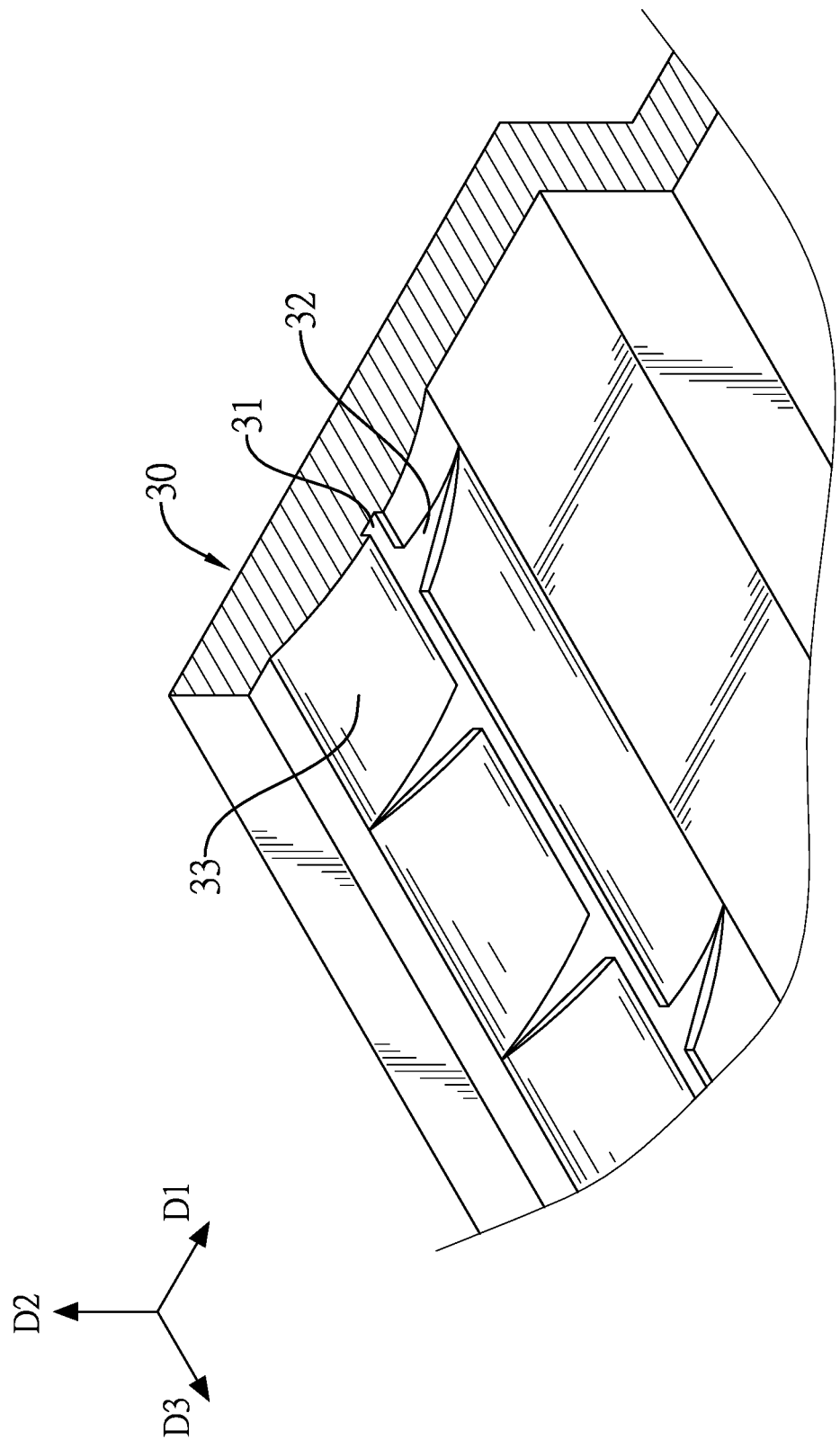
FIG. 6 is a partial perspective view of a second frame of the frame assembly in accordance with the present invention.
Figure 9:
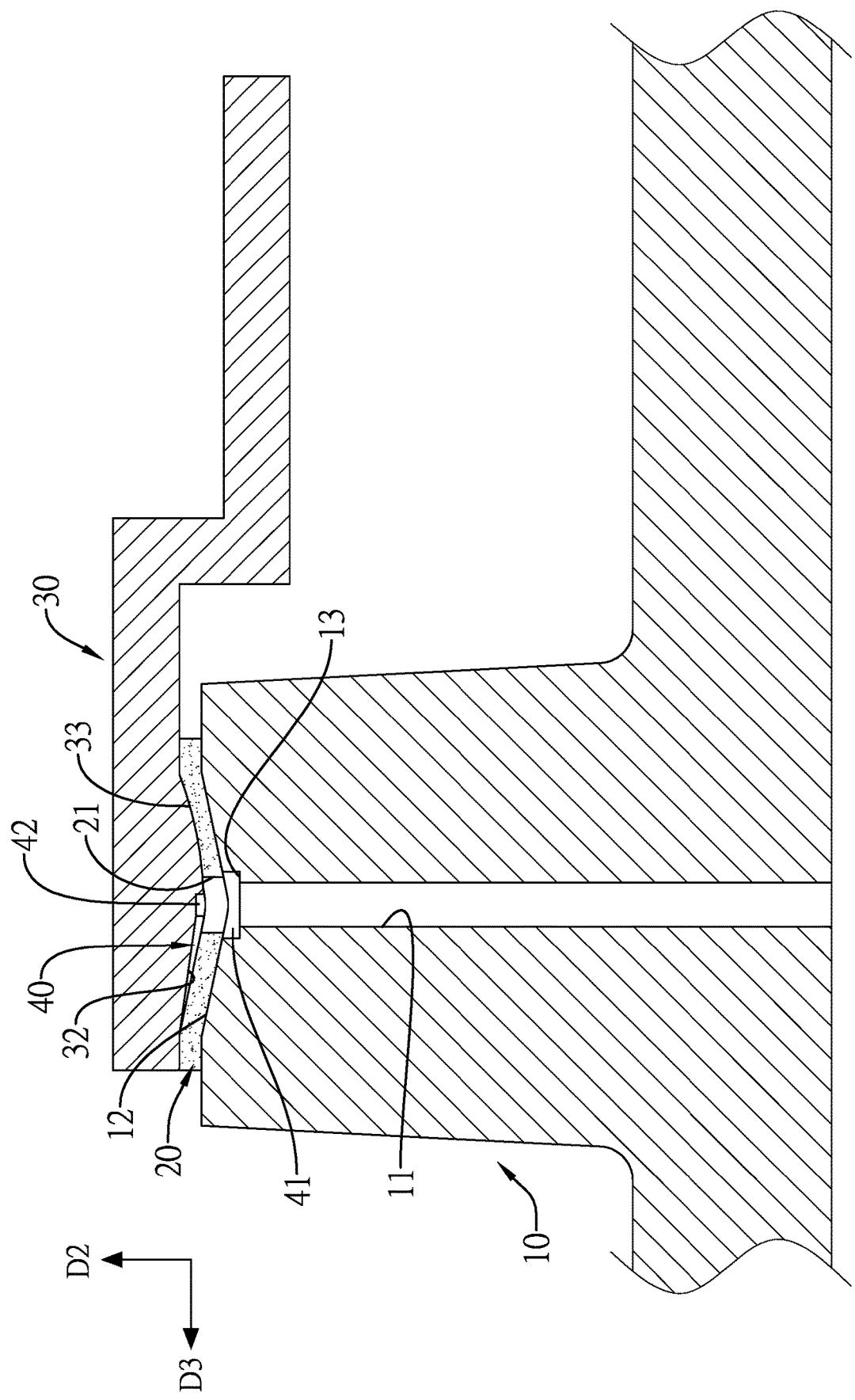
FIG. 9 is a sectional view across line B-B in FIG. 3.
Figure 10:
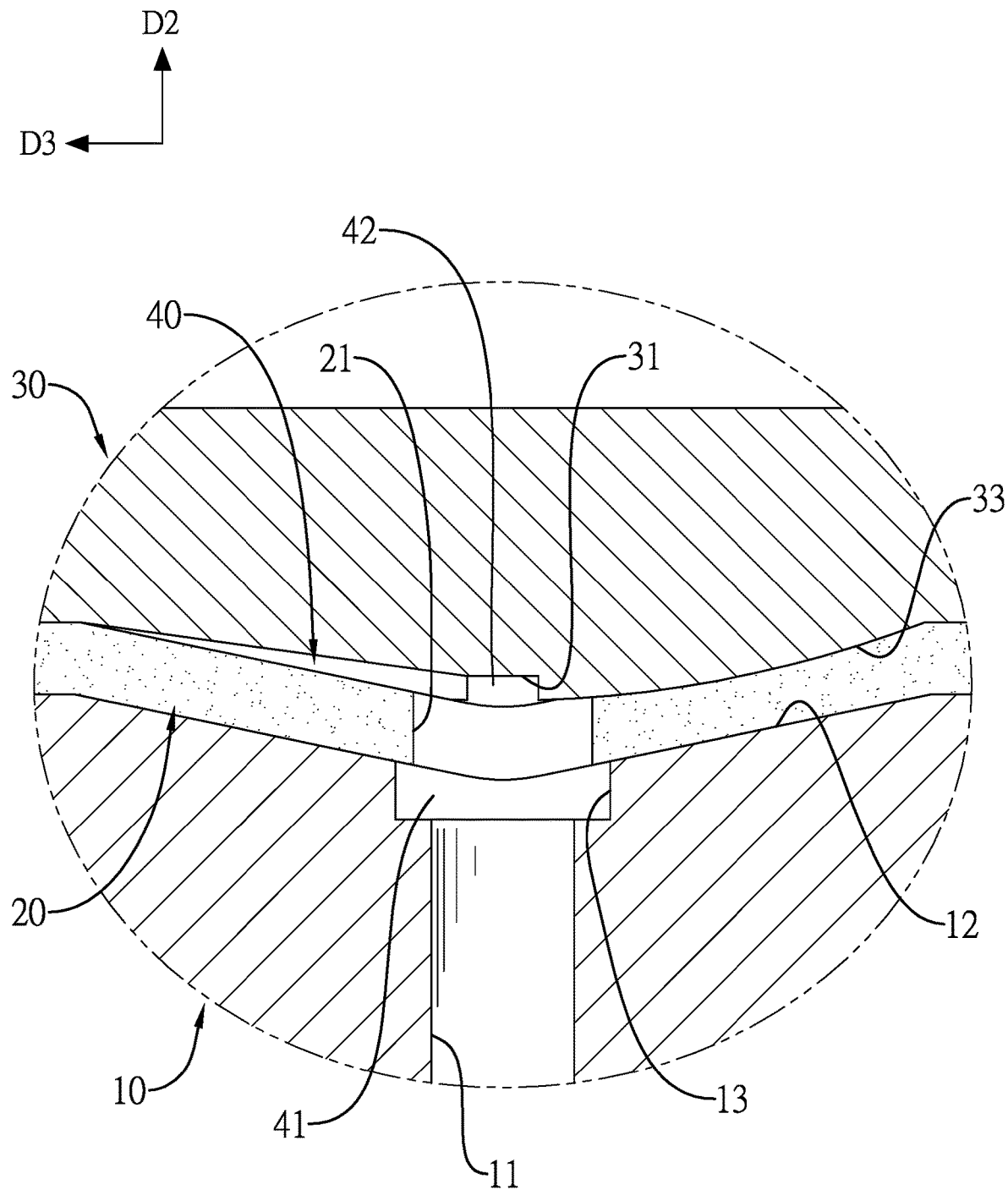
FIG. 10 is a partial enlarged sectional view of FIG. 9.

As shown in FIGS. 6, 9 and 10, the second frame 30 has a groove 31 disposed at a side, facing the first frame 10, of the second frame 30. The groove 31 extends along the first direction D1 and is in communication with the second venting passage 42. With the groove 31, the residue air between the second frame 30 and the adhesive layer 20 is evacuated along the groove 31, therefore increasing venting efficiency. The first frame 10 has a slot 13 disposed at a side, facing the second frame 30, of the first frame 10. The slot 13 extends along the first direction D1 and is in communication with the at least one exhausting passage 11. A portion of the adhesive layer 20 is disposed inside the slot 13. The first venting passage 41 is in communication with the slot 13. While evacuating the air, the negative pressure will be generated accordingly, because the slot 13 and the groove 31 both extend along the first direction D1, the air can easily flow along the first direction D1 toward a middle position between the slot 13 and the groove 31, and then is evacuated along the second direction D2 through the at least one exhausting passage 11. So, the slot 13 and the groove 31 can increase the air discharging efficiency.

Furthermore, the second frame 30 has at least one air-escaping recess 32, which is in communication with the groove 31 and extends toward a direction away from the groove 31. By the at least one air-escaping recess 32 in communication with the groove 31, the residue air between the second frame 30 and the adhesive layer 20 can be evacuated through the at least one air-escaping recess 32, thereby efficiently increasing a discharging quantity of the residue air between the second frame 30 and the adhesive layer 20. In a preferable embodiment of the present invention, the second frame 30 has multiple said air-escaping recesses 32. The multiple air-escaping recesses 32 are, at spaced intervals, connected to the groove 31 and extend toward the direction away from the groove 31. The multiple air-escaping recesses 32 communicate with different portions of the groove 31, therefore increasing the air discharging efficiency at different portions of the groove 31, further facilitating the residue air to enter the multiple air-escaping recesses 32 more easily and be evacuated. The adhesive layer 20 is filled into the groove 31 and the multiple air-escaping recesses 32 of the second frame 30, increasing the adhered area of the adhesive layer 20 to increase the adhesive strength. Besides, by the multiple air-escaping recesses 32 arranged in a staggered manner along the groove 31, the multiple air-escaping recesses 32 are distributed evenly on the second frame 30, thereby increasing the discharging quantity of air and the adhesive strength of the adhesive layer 20.

Figure 7:
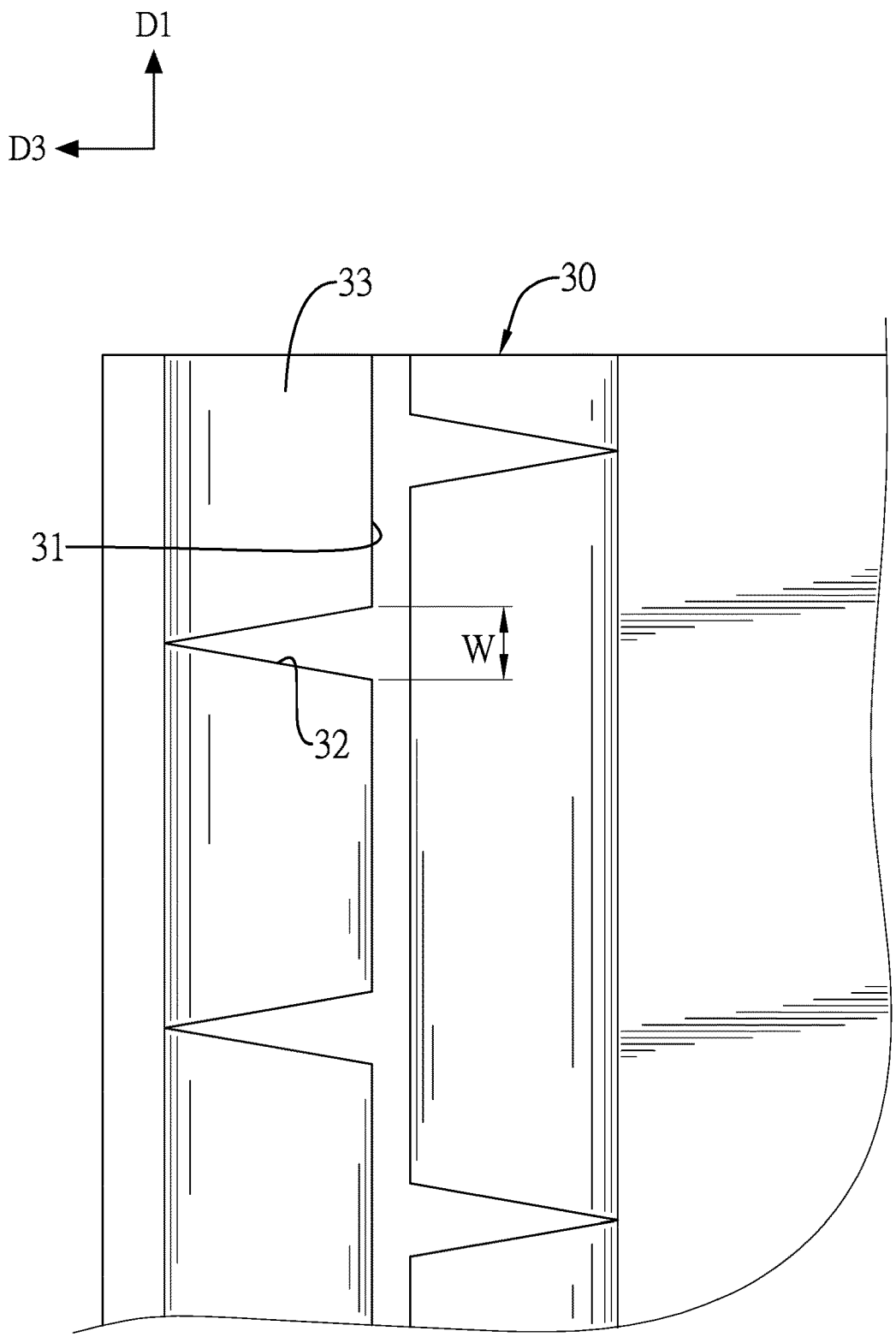
FIG. 7 is a partial bottom view of the second frame of the frame assembly in accordance with the present invention.

Preferably, the frame assembly has a third direction D3, which is non-parallel to the first direction D1 and the second direction D2. As shown in FIGS. 6 and 7, the at least one air-escaping recess 32 extends along the third direction D3. With the adhesive layer 20 filled into the at least one air-escaping recess 32, a bonding strength of the first frame 10 and the second frame 30 along the first and the third directions D1, D3 is enhanced. Preferably, the third direction D3 is perpendicular to the first direction D1 and to the second direction D2, thereby increasing the bonding stability of the frame assembly in three dimensions.

Besides, as shown in FIGS. 6 and 7, a sectional area of a side, away from the groove 31, of the at least one air-escaping recess 32 is smaller than a sectional area of a side, communicating with the groove 31, of the said air-escaping recess 32. While the vacuum device evacuates the air in the frame assembly through the at least one exhausting passage 11, as a sectional area of the said air-escaping recess 32 changes, a pressure difference occurs in the at least one exhausting passage 11. The cross-sectional area of the air-escaping recess 32 on the side away from the groove 31 is smaller and therefore has a higher pressure, while the cross-sectional area of the air-escaping recess 32 communicating with the side of the groove 31 is larger and therefore has a lower pressure. Therefore, the air is prompted to flow out through the at least one through hole 21, which communicates with the groove 31, of the adhesive layer 20, and be evacuated from the at least one exhausting passage 11, further increasing the air discharging efficiency and adhesion tightness of the adhesive layer 20. Because of that, a tail end of the at least one air-escaping recess 32 being away from the groove 31 has an effect of ventilation, which benefits increasing extra adhesive force.

Figure 8:
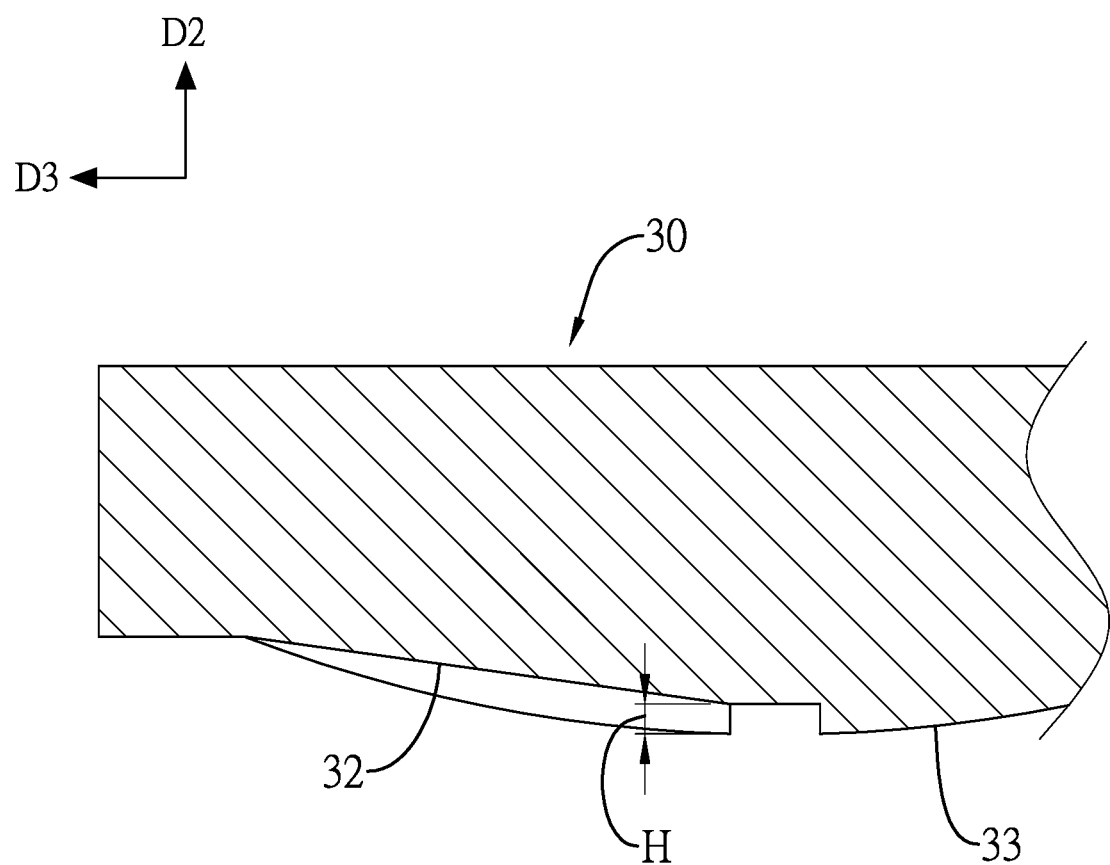
FIG. 8 is a partial front sectional view of the second frame of the frame assembly in accordance with the present invention.

Furthermore, as shown in FIGS. 6 to 8, by changing a width W or a height H of a section of the at least one air-escaping recess 32, the sectional area of the said air-escaping recess 32 is changed. In an embodiment of the present invention, the width W of the section of the at least one air-escaping recess 32 is parallel to the first direction D1, and the height H of the section of the said air-escaping recess 32 is parallel to the second direction D2. Preferably, as shown in FIG. 7, the width W of the side, away from the groove 31, of the at least one air-escaping recess 32 is less than the width W of the side, communicating with the groove 31, of the said air-escaping recess 32. Further, as shown in FIG. 8, the height H of the side, away from the groove 31, of the at least one air-escaping recess 32 is less than the height H of the side, communicating with the groove 31, of the said air-escaping recess 32, therefore increasing the air discharging efficiency in the said air-escaping recess 32. When either the width W or the height H of the section of the at least one air-escaping recess 32 meets the criteria that its length is longer at a side adjacent to the groove 31 and shorter at the side away from the groove 31, the air discharging efficiency will be increased.

Additionally, as shown in FIGS. 1 and 2, the first frame 10 has a first assembling portion 12 extending along the first direction D1. The second frame 30 has a second assembling portion 33 disposed at the side, facing the first frame 10, of the second frame 30. The first assembling portion 12 and the second assembling portion 33 are respectively connected to two sides of the adhesive layer 20. One of the first assembling portion 12 and the second assembling portion 33 protrudes and the other of the first assembling portion 12 and the second assembling portion 33 is recessed. The containing space 40 is formed between the first assembling portion 12 and the second assembling portion 33. A concave-convex design of the first assembling portion 12 and the second assembling portion 33 benefits the staff for guiding in alignment during assembly, thereby increasing the assembling convenience. Other than that, the concave-convex design increases a contact area of the first assembling portion 12 and the second assembling portion 33 with the adhesive layer 20 under a limitation of a certain width, thereby increasing the adhered area of the adhesive layer 20, so as to increase the adhesive strength. Preferably, the slot 13 of the first frame 10 is disposed at a middle of the first assembling portion 12 and communicates with the at least one exhausting passage 11. The first assembling portion 12 of the first frame 10 is recessed. The second assembling portion 33 of the second frame 30 is protruded. As the at least one exhausting passage 11 communicates with the first assembling portion 12, which is recessed, the containing space 40 between the first frame 10 and the second frame 30 is recessed downward to the at least one exhausting passage 11, so the venting efficiency and the vacuum force are both increased.

In addition, no matter which one of the first assembling portion 12 and the second assembling portion 33 is recessed and the other one of them is protruded, effects of guiding in alignment and increasing the adhered area are ensured. Furthermore, the protruded one of the first assembling portion 12 and the second assembling portion 33 has an arched surface, and the recessed one of the first assembling portion 12 and the second assembling portion 33 has two opposite sloping surfaces. While assembling the frame assembly, the staff connects the second assembling portion 33 of the second frame 30 and the first assembling portion 12 of the first frame 10 respectively to the two sides of the adhesive layer 20. At this time, by a design of the two opposite sloping surfaces tangent to the arched surface, when the first assembling portion 12 just connects the second assembling portion 33, the adhesive layer 20 will not adhere fully and flatly like adhering to a flat face, but will form two linear contacting regions, which means only partial contact. Therefore, this facilitates the staff to alter positions of the first frame 10 and the second frame 30, and has an effect of alignment guiding to save working hours and increase precision for assembly.

Figure 11:
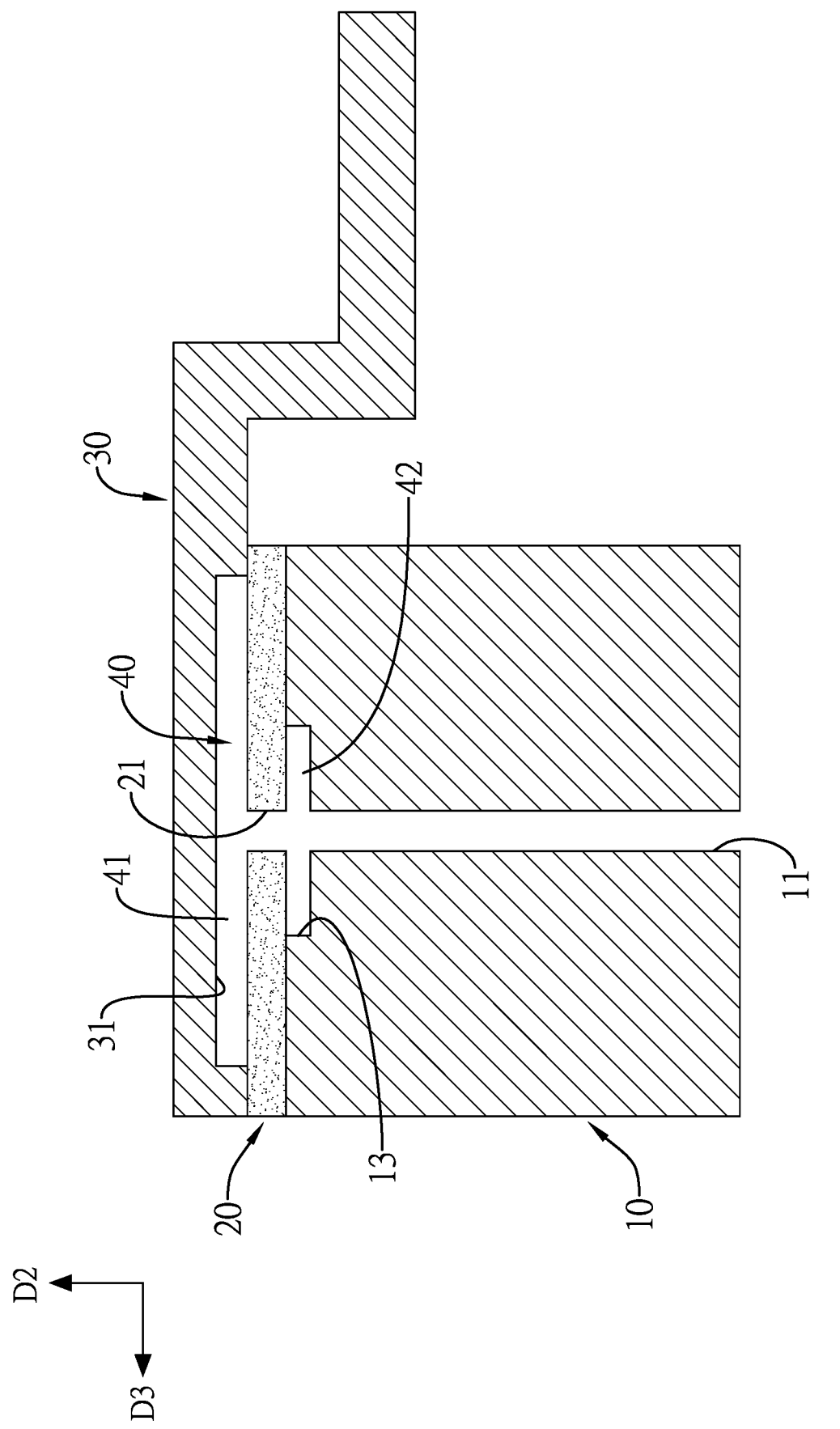
FIG. 11 is a view of a containing space of the frame assembly in accordance with the present invention.

As shown in FIG. 11, in another embodiment, the containing space 40 is formed when the first frame 10 connects the second frame 30. Even though without the concave-convex design, for example, the first frame 10 does not have the first assembling portion 12 and/or the second frame 30 does not have the second assembling portion 33, the first venting passage 41 and the second venting passage 42 are still formed at the two sides of the adhesive layer 20.

In addition, because of the slot 13 and the groove 31, the first frame 10 and the second frame 30 have an uneven-surface adhesion, instead of two flat surfaces adhering to each other, therefore increasing the adhered area of the adhesive layer 20, and thus enhancing the adhesive strength. Preferably, the slot 13 of the first frame 10 and the groove 31 of the second frame 30 overlap in position along the second direction D2, which means the slot 13, the at least one through hole 21 of the adhesive layer 20, and the groove 31 communicate directly along the second direction D2. Therefore, when flowing along the groove 31, the air can be led to the slot 13 smoothly, thereby increasing venting fluency to increase the venting efficiency of the residue air. Besides, the slot 13 and the groove 31 are respectively perpendicular to the at least one exhausting passage 11, thereby enhancing air evacuating efficiency.

Besides, two ends of the slot 13 of the first frame 10 along the first direction D1 is closed, and two ends of the groove 31 of the second frame 30 along the first direction D1 is also closed. After the second frame 30 is connected to the adhesive layer 20, an end, away from the groove 31, of the at least one air-escaping recess 32 of the second frame 30 is closed, therefore, the residue air in the containing space 40 between the first frame 10 and the second frame 30 can be thoroughly evacuated by the vacuum device.

Figure 12:
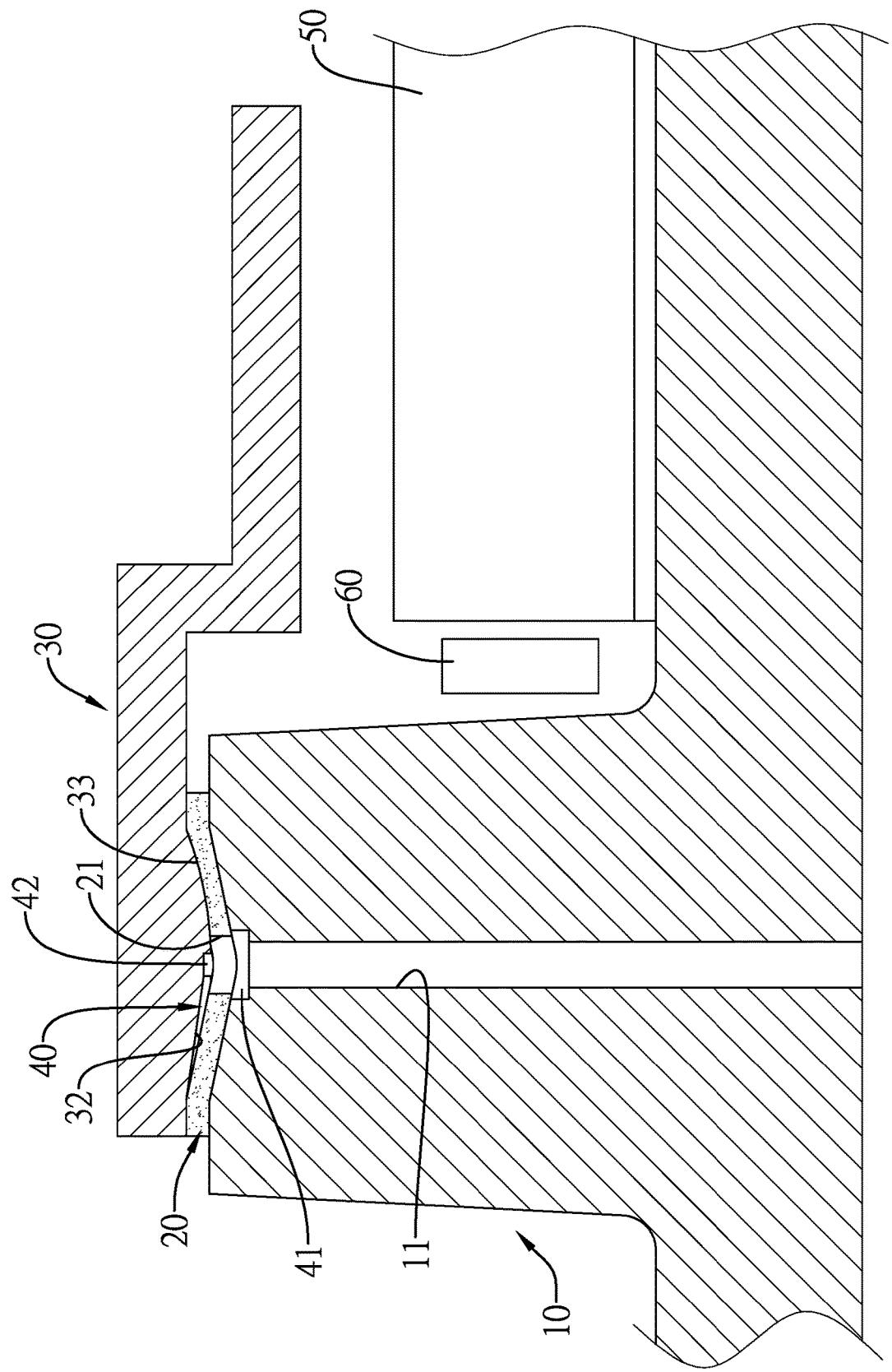
FIG. 12 is a front sectional view of a backlight module in accordance with the present invention.

With reference to FIG. 12, a backlight module in accordance with the present invention comprises one said frame assembly, a light guiding plate 50 and a light-emitting unit 60. The light guiding plate 50 is mounted between the first frame 10 and the second frame 30. The light-emitting unit 60 is mounted between the first frame 10 and the second frame 30 and faces toward the light guiding plate 50. To be specific, the light guiding plate 50 and the light-emitting unit 60 are accommodated inside the first frame 10. The second frame is connected to the first frame 10 via the adhesive layer 20, and therefore the light guiding plate 50 and the light-emitting unit 60 are disposed between the first frame 10 and the second frame 30. The second frame 30 covers a periphery of the light guiding plate 50.

In a preferable embodiment of the backlight module, the first frame 10 is a back plate or a cover and the second frame 30 is a plastic frame or a molding frame. The back plate or the cover is usually made of metals and thus is harder to be processed, but the plastic frame or the molding frame is made of plastics or resin, so processing the plastic frame or the molding frame to form complicated structures, such as the at least one air-escaping recess 32 or the second assembling portion 33 with protruded shapes, is easier and low-cost. Other than that, a design of the at least one exhausting passage 11 penetrating through the first frame 10 along the second direction D2 is easy to process as well. Besides, the containing space 40 between the first frame 10 and the second frame 30 can surround the backlight module or can be formed at either side of the backlight module, as both options can increase the bonding stability of the backlight module and reduce the risk of instability or peeling of the plastic frame.

Figure 13:
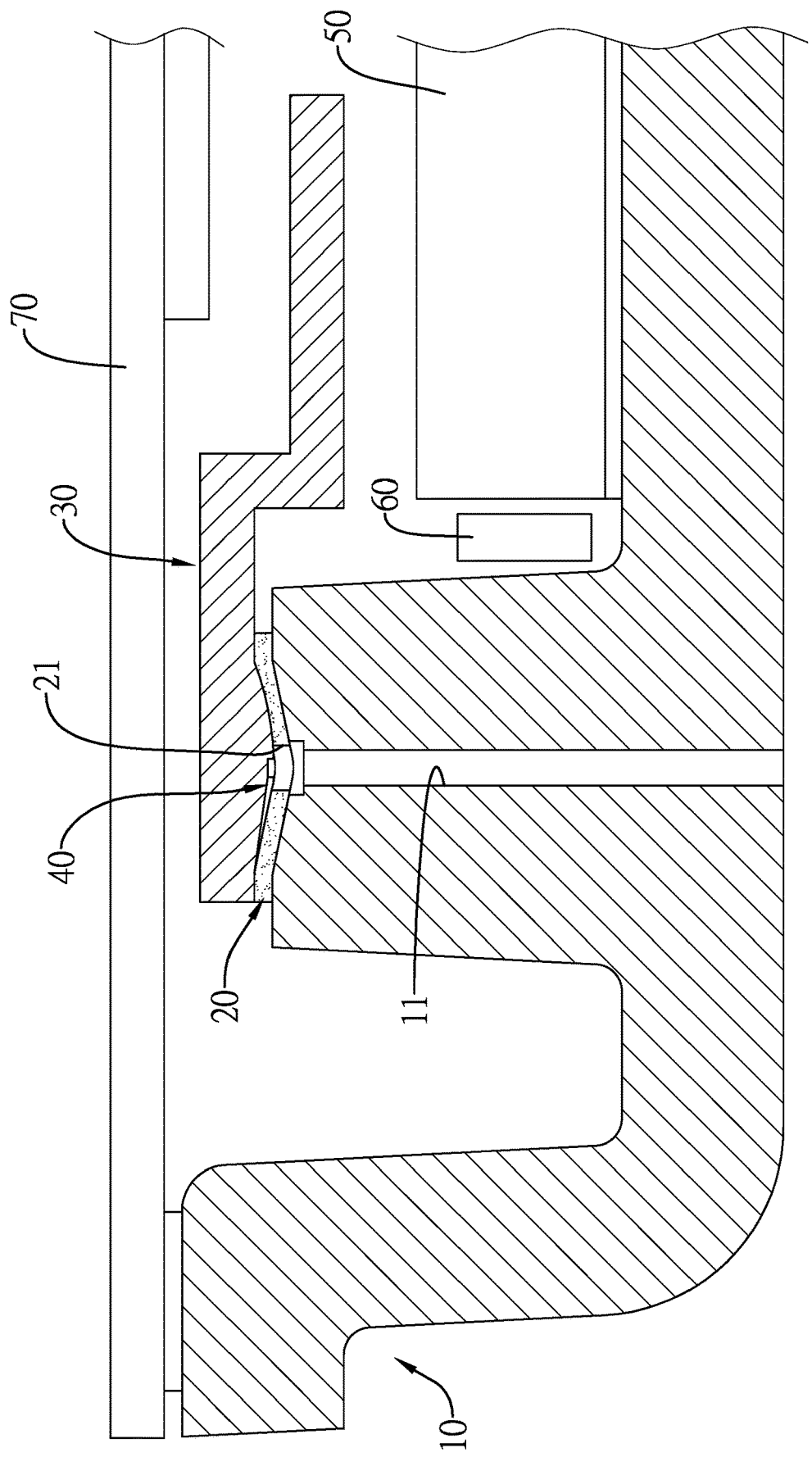
FIG. 13 is a front sectional view of a display device in accordance with the present invention.

With reference to FIG. 13, a display device in accordance with the present invention comprises one said backlight module and a display panel 70. The display panel 70 is mounted at one of the first frame 10 and the second frame 30. The light guiding plate 50 faces the display panel 70. To be specific, when the first frame 10 is the back plate and the second frame 30 is the plastic frame, and when the light guiding plate 50 and the light-emitting unit 60 are contained inside the first frame 10, the display panel 70 will be mounted at the first frame 10 and disposed at a side, away from the light guiding plate 50, of the second frame 30, and the display panel 70 will cover the light guiding plate 50.

By the frame assembly applied in the display device, because the first frame 10 and the second frame 30 are not fixed with each other with large-volume mechanical clipping structures but are adhered via the adhesive layer 20, the display device achieves a narrow-bezel design and enhances an assembling stability at the same time. Therefore, the display device suits for application in narrow frame of display models, for example, vehicle products. Besides, for a display model having a reduced adhered area due to a narrow frame, without adding additional components and under a limited adhered area, generating negative pressure by evacuating air will deform the adhesive layer 20 along with assisting fixation with vacuum force. Hence, the fixation and stability between components are further enhanced. Besides, generating negative pressure with air evacuation can further reduce the re-working hours and product loss, and decrease risk of post-sale damage to products.

Besides, other than applied in the backlight module and the display device, the frame assembly can be applied in other adhering-bonding components to increase the adhering-bonding strength. For example, the frame assembly can be applied to structures having limited adhered areas, or applied to structures incompatible with mechanical fixations due to narrow borders, thereby increasing the assembling stability and enlarging the application scope of the frame assembly of the present invention.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the board general meaning of the terms in which the appended claims are expressed.

The invention claimed is:

1. A frame assembly having a first direction and comprising:
   a first frame having
      at least one exhausting passage formed inside the first frame; an adhesive layer having
      at least one through hole; and
   a second frame connected to the first frame via the adhesive layer;
   wherein a containing space is defined by the first frame and the second frame together and extends along the first direction; the at least one exhausting passage of the first frame is in communication with the containing space and an external environment of the first frame; the adhesive layer is disposed in the containing space to divide the containing space into
- a first venting passage adjacent to the first frame; and
- a second venting passage adjacent to the second frame; the first venting passage and the second venting passage being in communication with each other via the at least one through hole of the adhesive layer.

2. The frame assembly as claimed in claim 1, wherein the second frame has
- a groove disposed at a side, facing the first frame, of the second frame; the groove extending along the first direction and being in communication with the second venting passage.

3. The frame assembly as claimed in claim 2, wherein the second frame has
- at least one air-escaping recess being in communication with the groove and extending toward a direction away from the groove.

4. The frame assembly as claimed in claim 2, wherein the second frame has
- multiple air-escaping recesses being in communication with the groove and extending toward a direction away from the groove, and the multiple air-escaping recesses communicating with different portions of the groove.

5. The frame assembly as claimed in claim 3, wherein a sectional area of a side, away from the groove, of the at least one air-escaping recess is smaller than a sectional area of a side, communicating with the groove, of the air-escaping recess.

6. The frame assembly as claimed in claim 3, wherein a width of a side, away from the groove, of the at least one air-escaping recess is less than a width of a side, communicating with the groove, of the air-escaping recess.

7. The frame assembly as claimed in claim 1, wherein the first frame has
- a first assembling portion extending along the first direction; the second frame has
- a second assembling portion disposed at a side, facing the first frame, of the second frame;
- wherein the first assembling portion and the second assembling portion respectively are connected to two sides of the adhesive layer; one of the first assembling portion and the second assembling portion is protruded and the other of the first assembling portion and the second assembling portion is recessed; and the containing space is formed between the first assembling portion and the second assembling portion.

8. The frame assembly as claimed in claim 7, wherein one of the first assembling portion and the second assembling portion is protruded and has an arched surface, and the other of the first assembling portion and the second assembling portion is recessed and has two opposite sloping surfaces.

9. The frame assembly as claimed in claim 1, wherein the first frame has
- a first assembling portion extending along the first direction and having
  - a slot disposed at a middle of the first assembling portion and being in communication with the at least one exhausting passage; the adhesive layer partially disposed in the slot; the first venting passage being in communication with the slot.

10. The frame assembly as claimed in claim 1, wherein the at least one through hole and the at least one exhausting passage at least partially overlap with each other.

11. The frame assembly as claimed in claim 1, wherein a diameter of the at least one through hole is larger than a diameter of the at least one exhausting passage.

12. The frame assembly as claimed in claim 1, wherein the frame assembly has a second direction; the first direction and the second direction are non-parallel; the at least one exhausting passage of the first frame penetrates through the first frame along the second direction.

13. A backlight module comprising:
- the frame assembly as claimed in claim 1;
- a light guiding plate mounted between the first frame and the second frame; and
- a light-emitting unit mounted between the first frame and the second frame and facing toward the light guiding plate.

14. A display device comprising:
- the backlight module as claimed in claim 13; and
- a display panel mounted at one of the first frame and the second frame; the light guiding plate facing the display panel.

* * * * *